United States Patent [19]

Miller et al.

[11] Patent Number: 4,946,710

[45] Date of Patent: Aug. 7, 1990

[54] METHOD FOR PREPARING PLZT, PZT AND PLT SOL-GELS AND FABRICATING FERROELECTRIC THIN FILMS

[75] Inventors: William D. Miller, Rio Rancho; Leo N. Chapin; Joseph T. Evans, Jr., both of Albuquerque, all of N. Mex.

[73] Assignee: National Semiconductor Corporation, Santa Clara, Calif.

[21] Appl. No.: 57,323

[22] Filed: Jun. 2, 1987

[51] Int. Cl.$^5$ .............................................. B05D 5/12
[52] U.S. Cl. ................................. 427/126.3; 252/62.9; 427/96; 427/162; 427/226; 427/240; 427/376.2
[58] Field of Search ............... 427/240, 167, 108, 164, 427/165, 87, 126.3, 376.2, 96, 79, 226; 423/263, 598, 608, 594; 252/62.9

[56] References Cited

U.S. PATENT DOCUMENTS

| | | |
|---|---|---|
| 3,124,478 | 3/1964 | Cirkler et al. |
| 3,330,967 | 7/1967 | Baardewijk et al. ................. 307/88 |
| 3,413,083 | 11/1968 | Dandliker et al. .................. 428/263 |
| 3,637,531 | 1/1972 | Faxon et al. ........................ 423/263 |
| 3,728,694 | 4/1973 | Rohrer ............................. 340/173.2 |
| 3,917,780 | 11/1975 | Mazdiyasni et al. |
| 3,923,675 | 12/1975 | Mazdiyasni et al. |
| 4,330,593 | 5/1982 | Shrout et al. ....................... 427/100 |
| 4,477,401 | 10/1984 | Hagemann et al. |

OTHER PUBLICATIONS

Principles and Applications of Ferroelectrics and Related Materials, Lines and Glass, pp. v–vii and 559–561, 579.

"Sol-Gel Processing of PbTiO$_3$, PbZrO$_3$, PZT, PLZT Thin Films", K. D. Budd et al., Brit. Cer. Proc., vol. 36, (1985) pp. 107–121.

"Preparation of Ferroelectric Compounds", J. Fukushima et al., Journal of Materials Science, 19 (1984), pp. 595–598.

"Crystallization and Transformation of Distorted Cubic BPBTIO$_3$", O. Yamaguchi et al., J. Am. Ceram., Soc. 69 [10] C-256-C-257 (1986).

"Ferroelectric Arrays: Competition for Core and Semiconductor Memories", Digital Design, Jun. 1973, pp. 30–32.

"Structure Evolution in Sol-Gel Derived Lead Titanate-Base Materials and Application to the Processing of Thin Dioelectric Layers", Thesis by K. D. Budd, 1986.

"Sol-Gel Processing of Lead Zirconate Films", R. Lipeles, N. Ives, N. Leung (1985).

"Conductivity and Anomalous Polarization in Ceramic Ferroelectrics with Perovskite Structure", O. I. Prokopalo, vol. 14, pp. 683–685 (1976).

"Amorphous and Crystalline Dip Coatings Obtained from Organometallic Solutions: Procedures, Chemical Processes and Products", H. Dislich & E. Hussmann, Thin Solid Films, vol. 77, pp. 129–139 (1981).

"Dielectric Constant of Amorphous PbTiO$_3$", M. Takashige, T. Nakamura, N. Tsuya, K. Arai, H. Ozawa & R. Uno, Japanese Journal of Applied Physics, vol. 19, No. 9, pp. L555–L558, (8/80).

(List continued on next page.)

Primary Examiner—Janyce Bell
Attorney, Agent, or Firm—Richards, Medlock & Andrews

[57] ABSTRACT

A method to produce thin films suitable for fabricating ferroelectric thin films. The method provides for selection of the predetermined amounts of lead, lanthanum, zirconium, and titanium precursors which are soluble in different solvents. Dissolving predetermined amounts of the precursors in their respective solvents in proportions such that hydrolyze reaction rate for each metal precursor will be approximately equal. The precursors and solvents are mixed, and water is added to begin a hydrolysis reaction. After the hydrolysis the solution is heated to drive off the excess water and solvent to promote the formation of a sol-gel. The sol-gel is then applied to a thin substrate and sintered to produce the ferroelectric film.

36 Claims, 1 Drawing Sheet

OTHER PUBLICATIONS

"Glassy and Crystalline Systems from Gels: Chemical Basis and Technical Application", H. Dislich, Journal of Non-Crystalline Solids, vol. 57, pp. 371–388 (1983).

"History and Principles of the Sol-Gel Process, and Some New Multicomponent Oxide Coatings", H. Dislic and P. Hinz, Journal of Non-Crystalline Solids, vol. 48, pp. 11–16 (1982).

"Colloidal versus Polymer Gels, and Monolithic Transformation in Glass-Forming Systems", D. P. Partlow & B. E. Yoldas, Journal of Non-Crystalline Solids, vol. 46, pp. 153–161 (1981).

"Applications of Sol-Gel Methods for Glass and Ceramics Processing", J. D. McKenzie, Ultrastructure Processing of Ceramics, Glasses and Composites, pp. 15–26 (1894).

METHOD FOR PREPARING PLZT, PZT AND PLT SOL-GELS AND FABRICATING FERROELECTRIC THIN FILMS

TECHNICAL FIELD

The present invention relates to methods for preparing sol-gels and the subsequent use of these gels to fabricate ferroelectric thin films of compositions from the PLZT family which are particularly suited for applications in electrical devices such as random access memory devices and optical sensors.

BACKGROUND ART

In the art of microcircuit designs and other electronic applications it was recognized some years ago that ferroelectric materials could be used much like capacitors in a dynamic random access memory (RAM). The term ferroelectric material is somewhat of a misnomer because many of these materials do not contain iron. However, the name implies that they possess ferroelectric properties analogous to their ferromagnetic counterparts. It was hypothesized early in the electronic memory industry that a nonvolatile random access memory with high performance and good economics could possibly be fabricated if a suitable ferroelectric material were found, such as discussed in "Ferroelectric Arrays: Competition for Core and Semiconductor Memories" page 30–32 of *Digital Design*, June, 1973.

Thus, the art has searched for a ferroelectric material that was easily deposited, sputtered, or otherwise controllably applied to suitable substrates and would have properties compatible with the subsequent MOS processing or other electrical applications. It was recognized early that the thin film needed to be defect free, retain its polarity, and have good fatigue resistance. A significant potential advantage over current non-volatile NMOS technology is that ferroelectric memory is known to have an endurance cycle of better than $10^{10}$ read and write cycles compared to $10^6$ to $10^7$ cycles of the floating gate MOS technology.

Different ferroelectric materials have been proposed, such as potassium nitrate ($KNO_3$), as discussed in the above referenced Digital Design article and also in the March, 1983 issue of Computer Design. Other materials proposed were PZT and PLZT. PZT is an acronym for a lead-zirconate-titanate ceramic. PLZT is an acronym for a ceramic of lead, lanthanum, zirconium and titanium. ($PbOLa_2O_3$-$ZrO_2$-$TiO_2$). Another proposed material was lead titanate ($Pb\,TiO_3$), as discussed in "Crystallization and Transformation of Distorted Cubic $PbTiO_3$" pages C-256, 7, J. Am. Ceram. Soc. 69, October, 1986.

Sputtering techniques have been investigated for applying these films. This technique suffers from the disadvantages that it requires expensive equipment, the composition deposited does not always correlate to the mixture utilized for the sputtering, which gives rise to quality control problems and, importantly, films deposited on certain substrates were not smooth and contained cracks and other deficiencies. Attempts to sputter PZT films onto silicon substrates, the most common substrate in the semiconductor industry, are characterized by microcracks probably resulting from different thermal coefficients between the silicon substrate and the sputtered PZT film, which in order to achieve a useful thickness required multiple sputtering cycles to achieve the desired thickness. Furthermore, the very low deposition rates in sputtering are not practical for commercial scale production. Also, the high temperature necessary for sputtering are not desirable because it disturbs dopants in the substrate.

Some investigation of sol-gel processing of PZT and PLZT to provide thin films is recorded in "SolGel Processing of $PbTiO_3$, $PbZrO_3$, PZT, PLZT Thin Films", *Brit. Cer. Proc. Vol.* vol 36, 1985 pages 107–121. See also "Preparation of Ferroelectric PZT Films by Thermal Decomposition of Organometallic Compounds" pages 595–598, Journal of Materials Science 19 (1984). This article reports some successes but the techniques used were deficient in several regards, such as, the reported crystallization temperature is too high resulting in the grain structure produced is too large for capacitor areas required in microelectronic memories, and some of the films had problems with cracking. A method which uses the lower temperature is desirable because diffusion of dopants in the substrate becomes significant if temperatures exceed 900° C. and adhesion problems related to metal pads and interface occur above about 750° C. Furthermore, the time required to produce a usable thickness was too long. Thus, for a long time there has been a need in the industry to find a method and composition to produce a ferroelectric material which in practice could be produced economically, be applied to various substrates in the required purity and have physical characteristics necessary for use in thin films suitable in the manufacture of integrated circuits. Furthermore, not only was the development of suitable materials required but also that a process be developed by which suitable materials could be reproducibly and confidently applied to substrates having the desired composition as well as the desired adhesion, integrity, thickness, and other physical characteristics necessary for dependable performance for supporting commercial utilization.

A sol-gel refers to a composition which is made as a solution then formed into a gel which forms an open lattice structure when it is dried. The present invention utilizes sol-gels to produce thin films in the PLZT family of films such as PLZT, PZT, and PLT compositions which can be utilized in fabricating ferroelectric thin films reproducibly and having required physical and chemical characteristics for reliable performance in electrical, as well as optical applications. The present invention is advantageous in that PLZT, PLT and PZT films of varying compositions can be easily applied as thin films to suitable substrates by spin coating methods with equipment common in the semiconductor industry. These films can be applied with a high degree of quality control and the composition of the applied film can be easily and reliably selected as desired using the method of the present invention.

SUMMARY OF THE INVENTION

In one aspect the invention relates to a procedure for producing a homogeneous and uniform mixture of two or more of the following metals: lead, lanthanum, titanium and zirconium. The homogeneous mixture is then processed to achieve a sintered thin film of a composition within the PLZT family. The sintered PLZT family films are those films comprised of oxides of two or more of the metals, thus the films can contain PbO (lead oxide) $La_2O_3$ (lanthanum oxide), $TiO_3$ (titanium oxide) and $ZrO_3$ (zirconium oxide). The most common are PLZT, PLT and PZT which can have various ratios of the components present. The films can also be PZ and PT. As used herein "PLZT family" will refer to a composition which when sintered will produce lead oxide and oxides of one or more of lanthanum, zirconium and titanium. "Sintered" refers to final ceramic composition of the PLZT family. As used herein, "green" will refer to compositions and thin films of compositions which can be sintered to produce ceramic films of the PLZT family. The final sintered film is formed by first forming a sol-gel of precursors of the materials to be present in final film. In the case of a PLZT film the sol-gel is produced by forming a solution of precursors of the lead, lanthanum, zirconium and titanium, each of which is soluble in a different solvent and combining the precursors such that upon hydrolysis, the hydrolysis reaction of each precursor is approximately equal. Upon condensation, the mixture results in the formation of a homogeneous gel of the desired green composition. In one embodiment, the sol-gel can then be applied by spin coating techniques to a suitable substrate forming a green film which crystallized to form a sintered PLZT thin film upon the substrate.

Precursors of the metals, lead, lanthanum, zirconium and titanium to be present in the final film, each of which is soluble in a different solvent, are weighed to provide the required amount of each metal in the PLZT family, if any, desired in the final thin film to be applied to the substrate. Any precursors of lead, zirconium and titanium which can be hydrolyzed and which will condense into oligomers and polymers can be used, such as metal alkoxides, metal acetates and metal esters. A lanthanum precursor soluble in a different solvent from those for the other precursors can be used. However, because lanthanum is normally used in such a small amount, a lanthanum precursor soluble in a solvent or one of the other precursors can be used. Furthermore, it is not necessary that lanthanum be in the form of a precursor, although one may be used. There is such a small amount of lanthanum needed that it can be incorporated into the other precursors and solvents by solution or suspension with good results. The precursor compounds are dissolved in their respective solvents and each is diluted with solvent in proportions such that the reaction rates for the hydrolysis of each precursor are approximately equal. The precursors and their respective solvents are then mixed together with a predetermined amount of solvent at a temperature and with sufficient agitation to form a solution. A small amount of water is added to initiate sufficient hydrolysis reaction to create reactive sites upon the precursors. The amount of water is less than the amount which causes the hydrolysis reaction to proceed to the condensation reaction which result in precipitation of solids. The hydrolysis reaction can be stopped or quenched by the dilution of the mixture with excess additional solvents. In the alternative the hydrolysis reaction in some cases can be controlled by the rapid cooling of the mixture (without the addition of additional solvents) before the condensation reaction begins to precipitate solids. If the reaction is quenched by dilution with additional solvents, it is preferred to use a solvent mixture in the same ratios used previously to dissolve the precursors. The solution is then gelled by boiling the mixture, thereby reducing the solvent content and initiating a condensation reaction between the reactive sites on the organametal compounds which forms an organo-metallic gel. Boiling is continued until the gel has the desired viscosity for the application of a thin film of the gel to a suitable substrate, such as a silicon substrate, by spin application techniques. The viscosity will vary with the composition of the final PLZT family film desired but in general, suitable viscosities are in the range of 1 to 5 centiposes, and preferably 1 to 3 centiposes. Preferably, these steps are carried out in an inert atmosphere or in a very dry atmosphere to prevent absorption of water vapor which would carry the hydrolysis reaction beyond the desired degree.

In one embodiment of the present invention the sol-gel thus formed can be applied to the substrate by spin coating techniques. After application the green thin film of a composition from the PLZT family, the film is heated in a temperature from the range of 300° C. to about 425° C. to drive off excess solvent. About 2 to 4 minutes is usually sufficient. Additional layers of sol-gel can then be applied over the dried green film if desired. These additional layers may either be of the same or a different composition from the previous layer. They are then dried also. Thereafter, the resulting dried green film is then sintered in an oxygen containing atmosphere, and preferably in oxygen enriched over ambient air atmosphere, at a temperature of from 475° C. to about 700° C., and preferably 500° to about 650° C., and most preferably from about 550° to 650° C.

In another embodiment, a layer or layers of the sol-gel are applied to the substrate at room temperature without drying. After application of the green thin film of the gel by spinning techniques, the gel film is then vitrified by the heating of the gel to in the range of from about 475° C. to about 700° C., preferably 500° to 650° C. and most preferred 550° to 650° C. The rate of heating is controlled to prevent the too rapid evolution of solvent liquid which would disrupt the film, and preferably is done in an oxygen atmosphere to completely combust the solvents and to provide oxidation of the lead, lanthanum, zirconium and titanium to form the desired ceramic PLZT layer. Thereafter, a second layer of sol-gel can be applied to the sintered layer if a thicker film is desired. This embodiment of the invention is less desired than that previously discussed, when multiple layers are needed, because it typically requires a long time, creates more stress of MOS circuitry and other components, and is more difficult to etch.

In a preferred embodiment of the present invention, a PLZT film is prepared from a sol-gel wherein the lead precursor is lead tetracetate which is solubilized in glacial acetic acid at a temperature above about 70° C. The zirconium precursor is zirconium n-butoxide and, the titanium precursor is titanium (IV) isopropoxide. The zirconium tetrabutoxide can be dissolved in N-butanol and the titanium isopropoxide is dissolved in isopropanol. The zirconium and titanium precursors may be dissolved separately or in a solution of the N-butanol and the isopropanol. The lanthanum precursor is lanthanum, 2, 4 pentanedionate and is dissolved in butyl alcohol or isopropanol or mixture of the two. The zirconium precursor, or the mixture of the zirconium precursor and titanium precursor is combined with the lanthanum precursor and related solvents. The lanthanum, titanium and zirconium precursors and their solvents are then added to the solution of lead tetracetate and acetic acid solution at a temperature in the range of about 70°-90° C. and lightly agitated to obtain a clear homogeneous solution. Thereafter, deionized water in an amount sufficient to cause hydrolysis but not great enough to cause precipitation is added. It has been found that in the above described preferred embodiment, water in the range of about 1 to about 4 molar amounts, based on the moles of zirconium tetrabutoxide and titanium isopropoxide, is sufficient. The solution to which deionized water is added may have color or may become colored (but still remain clear, transparent) immediately upon addition of H₂O. Additional agitation with heating normally results in a clear, colorless (water white) solution in about 5 to about 10 minutes which is homogeneously mixed. It is after this 5 to 10 minute interval that excess solvent is added to quench the hydrolysis reaction. Excess solvents are then added, preferably, on a proportional basis while stirring the solution to quench the hydrolysis reaction. Thereafter, the mixture is boiled to drive off the water and reduce the solvent content and promote condensation of organometallic compounds (gelling) until the sol-gel has a viscosity appropriate for applying the sol-gel to suitable substrates by spinning techniques. When the desired viscosity is reached, the gel is applied to a substrate by spinning techniques and then heated in an oxygen containing atmosphere to promote crystallization and formation of the PLZT ceramic in a temperature range of about 475° C. to about 700° C.

DETAILED DESCRIPTION

The present invention relates to a method for producing ferroelectric films containing lead and one or more of the following: titanium, zirconium and lanthanum. Most commonly these are PLZT, PZT and PLT thin films. This is done by preparing a sol-gel of predetermined composition and applying it to substrates using spin coating techniques known in the semiconductor industry, such as described in *Semiconductor & Integrated Circuit Fabrication Techniques*, 1979, Reston Publishing Company Inc. pps. 105–107. PLZT is an abbreviation for lanthanum doped lead zirconate titanate, a ferroelectric material in the crystalline form. PZT is an abbreviation for lead zirconate titanate, a ferroelectric material in the crystalline form. PLT is an abbreviation for lanthanum doped lead titanate. Stoichiometry of these films can vary, the stoichiometry of any particular PLZT, PZT or PLT composition is expressed by the "lanthanum/zirconium/titanium" content in the resulting solid, solution.

$$Pb_{1-L/100}La_{L/100}(Zr_{Z/100}Ti_{T/100})O_3$$

PLZT family compositions with the following stoichiometry have been prepared 3/70/30; 3/60/40; 0/50/50 (PZT), 3/50/50; 3/40/60; 6/40/60; 8/40/60; 10/40/60; 0/60/40 (PZT) 8/0/100 (PLT); 15/0/100 (PLT) and 0/53/47 (PZT). The above expression is based on percentages by mole ratios. The expression L/Z/T as in 3/70/30 (for example) is shorthand for expressing %Pb + %La = 100 = %Zr + %Ti where percentage is based on atomic % or mole ratios of atoms. A 3/70/30 (PLZT) is 97 atoms Pb and 3 atoms La to 70 atoms Zr and 30 atoms Ti (or 97% Pb and 3% La to 70% Zr and 30% Ti). A 0/53/47 (PZT) is 100 atoms Pb and 0 (zero) atoms La to 53 atoms Zr and 47 atoms Ti. An 8/0/100 (PLT) is 92 atoms Pb and 8 atoms La to 0 (zero) atoms Zr and 100 atoms Ti.

$$(P+L):(Z+T)=100:100$$

or $$(P+L)=100=(Z+T)$$

or $$(P+L)+(Z+T)=200$$

The general chemical formula for PLZT compositions (which can include PZT and PLT) is:

$$Pb_{1-L/100}La_{L/100}(Zr_{Z/100}Ti_{T/100})O_3.$$

A 3/70/30 PLZT is:

$$PB_{1-3/100}La_{3/200}(Zr_{70/100}Ti_{30/100})O_3$$

which equals $$Pb_{0.97}La_{0.03}(Zr_{0.70}Ti_{0.30})O_3.$$

Note that in the formula the total of the Pb and La is 1 as is the total of the Zr and Ti. The sum of the Pb and La is "normalized" to 1, Pb+La=1.

Normally in the calculations for PLZT sol-gel synthesis, % by weight is not used.

Figure 1:
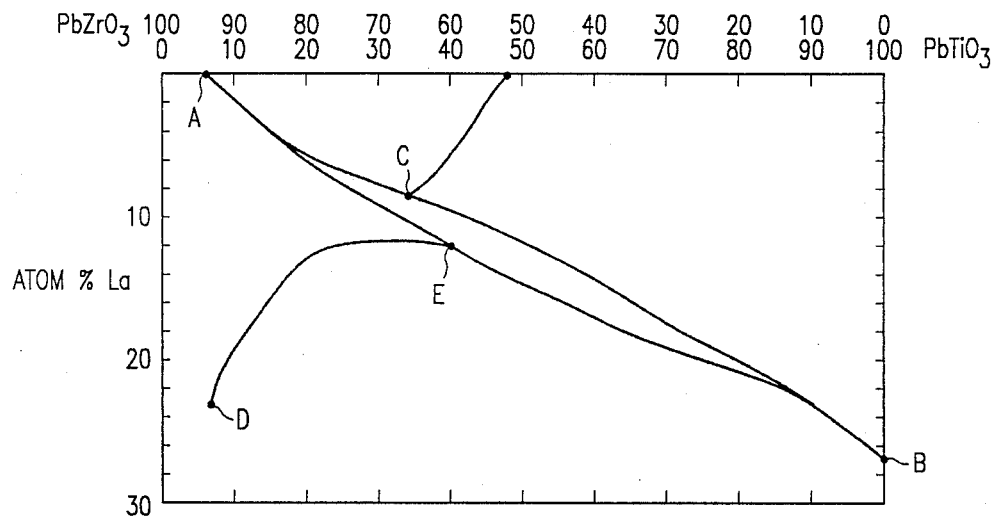
FIG. 1 is a phase diagram of some compositions which can be made with the method of the present invention.

FIG. 1 is a phase diagram of compositions at standard temperature and pressure (25° C. and 1 atmosphere). Points on the graph represent ferroelectric compositions made by the sol-gel method of the present invention. In general, compositions above the line ABC have ferroelectric properties. Compositions within area AED have electro optical properties and in area DEB the compositions can have electro optical properties created by field induced distortions.

One advantage of the present invention is that PLZT, PZT or PLT films of varying, but predetermined composition can be readily prepared and the composition of the deposited film can be accurately predicted, unlike prior sputtering techniques. Solgel is a term commonly used in the ceramics industry and indicates that processing starts with a solution which is then formed into a gel. The present invention relates to forming a partially gelled product which is then applied to a substrate as a film and oxidized to crystallize the film.

One of the deficiencies in the art prior to the present invention has been the inability to obtain, on a reproducible basis, deposited films from the PLZT family, such as, PLZT, PZT or PLT thin films having the same characteristics. The prior art sputtering techniques suffer from the difficiency that compositional control of the final film was difficult because of the different sputtering rate of the elements. It is postulated that deficiencies in film characteristics of films produced by earlier methods resulted from the failure of previous methods to apply PLZT, PLT, or PZT thin films which had the atoms of zirconium, lead, lanthanum, and titanium homogeneously mixed throughout the thin film (in PZT films there is no lanthanum). Although the inventors do not wish to be bound to any theory, it is believed that the previous techniques resulted in variable segregation of these materials in the final solid product which then resulted in varying ferroelectric properties of films, even though they contain the same relative proportions of lead, lanthanum, zirconium and titanium. The present invention relates to PLZT, PZT or PLT films which have a homogeneous distribution of the lead, lanthanum, zirconium and titanium which may be present in the resulting ceramic layer and further comprises a method for producing such a film.

In the method of the present invention, a solution of precursors is made containing lead, zirconium, titanium and lanthanum in the desired final film amounts. These solutions may be made from commercially available precursors such as lead tetraethylhexanoate, zirconium acetylacetonate, titanium tetrabutoxide, titanium isopropoxide, lead isopropoxide, zirconium tetrabutyoxide, lanthanum 2,4 pentanedianoate and other acetates and alkoxides and which are capable of forming organometallic polymer gels, can be utilized. In many instances the lanthanum precursor can be lanthanum itself, because it is present in such small amounts it can be effectively mixed without the need for it to be in the form of an acetate or alkoxide precursor. In general, it is desirable for the organic functional group of the precursor be selected such that it has a molecular weight of less than about 80 grams per mole. As the size of the organic functional group increases it is more likely to cause defects, such as cracks, in the final film when the organics are volatized. Lead tetra-ethylhexanoate is a less desirable precursor because the large organic group is more likely to result in defects in the final film. The preferred organic functional groups are methanol, butanol, ethanol, acetate and propanol. An important feature of the present invention is the achieving of a homogeneous gel in which the metals, such as lead, lanthanum, zirconium and titanium in a PLZT family film, are uniformly distributed throughout the polymer structure of the gel which will then result in the homogeneous distribution of these metals in the crystal lattice of the final inorganic material.

While not being bound by any theory, it is believed that a homogeneous distribution of metal ions in the polymer network results in lower crystallization temperatures and lower defect density. The crystallization temperature is believed to be lowered because it is limited by crystallization energy and not diffusion of metallic constituents in the network. This method avoids segregation, or the formation of pockets of one or more of the metals, which would result in differing ferroelectric properties in PLZT family films with the same overall compositions and differing properties in different locations within the same PLZT family thin film. In some instances such segregation can create localized areas that are not ferroelectric.

This homogeneous mixing is obtained by the utilization of precursors soluble in different solvents. While there may be some solubility of the various precursors in solvents for the other precursors, the solubility is generally so small in comparison to the primary solvent as to not be significant. The dissolved precursors are then combined in a mixture. In order to obtain a solution, it may be necessary to heat and agitate one or more of the precursors in the final mix of all the precursors and solvents. Certain of the precursors can be solubilized together then added to the other precursors, for example, the alkoxide precursors can be dissolved in a solution which is a mixture of both their respective solvents and then added to a solution of acetate precursors.

The amount of solvent utilized for each precursor is determined by the amount of solvent necessary such that the hydrolysis reaction rate of each metal precursor is approximately the same as determined by LeChatelier's principle. The amount of solvent for each can be determined by determining the rate of the hydrolysis reaction for each single precursor. Many of these reaction rates are reported in the literature or they can be determined by known experiment techniques. The amount of solvent used for each is then portioned such that the rate of reaction for each precursor is approximately equal. For example, if the reaction ratio of one of the precursor is three times faster than the others, which are approximately equal, then three times as much solvent is used for the faster reacting precursor. Thus, when all are combined the reaction rates are approximately equal. The hydrolysis reaction rates of the various precursors may be altered when the precursors are combined with the other solvents and other precursors. If this occurs the portions are adjusted accordingly. The initial quantities of solvents should be proportional and sufficient to completely dissolve the precursor for which it is used. The precursors and solvents are agitated, with heat if necessary, to form a homogeneous solution. In general, the formation of a homogeneous solution is indicated by the solution becoming clear from a cloudy condition. Clear does not mean that the solution is colorless but rather that it is transparent which indicates that the materials are distributed homogeneously and not merely suspended by mechanical or thermal agitation. Thereafter, a small amount of water is added to promote hydrolysis of the dissolved metal precursors. A complete hydrolysis reaction is not desired and should be avoided because that would result in the precipitation of the product as a solid and prevent its application as a homogeneous gel. In general, an amount of water between about 1 to 4 moles computed on a molar basis of the zirconium and titanium precursors has been found useful. The hydrolysis reaction is shown below:

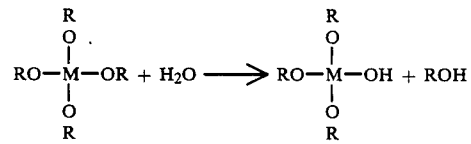

where M is a metal and OR is an alcohol functional group and ROH is an alcohol. For acetate precursors the reaction is exemplified as:

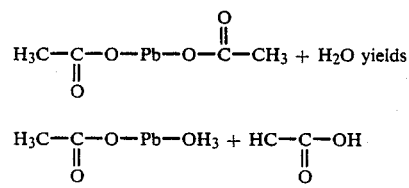

The hydrolysis reaction is quenched (slowed or halted) by the dilution of the mix with additional solvent preferably added in the same ratios as used previously. A five fold dilution has been found sufficient. Alternatively, the hydrolysis reaction may be quenched by the rapid cooling of the solution, with or without dilution. Quenching by cooling of the solution is less desired because it is more difficult to control.

Thereafter heat is applied to drive off the azitrope water and solvents, and to initiate a condensation reaction which then forms the organometal gels as exemplified above. The result is to form a gel which is a group of organo-metallic polymers having a homogeneous distribution of the metal atoms throughout the polymers. The boiling process is continued until a gel is obtained having the desired viscosity for application of the gel in a thin film to a substrate, such as a silicon or gallium arsenide wafer as commonly used in the semiconductor industry, by spin coating techniques. Useful viscosity for these metal organic gels has been found to be in the range of about 1 to 5 centipose, and preferably from 1 to 3 centipose.

It is desirable that this dissolving of the precursors and the boiling off of the solvents be done in an extremely dry atmosphere and preferably an inert atmosphere. This prevents the absorption of water vapors from the atmosphere which could result in the hydrolysis reaction proceeding too far and causing the precipitation of solids which is undesirable. One advantage of the present invention is that the formed gel can be stored under a dry or inert atmosphere for an extended period of time and can thus accommodate variations in demand and in production schedules.

The gel is applied to suitable substrates such as silicon wafers which have undergone preliminary processing for fabricating integrated circuit elements and which may have a patterned platinum electrode for receiving the PLZT family film. Spin application techniques of gels with viscosities from 1 to 5 centipose usually produce a thin green film of the gel between about 750 to about 1500 Angstroms in thickness. The green film is then oxidized to form the final sintered PLZT ceramic which has a homogeneous distribution of the lead, lanthanum, zirconium and titanium as was present in the gel applied. The formed sintered film of PLZT, PZT or PLT is normally about a third of the thickness of the gel film applied or from about 250 Angstroms to 500 Angstroms. Thicker sintered films can be formed in the substrate by applying multiple layers. For example, a first layer can be applied, sintered and then a second layer applied over the first and sintered.

In another aspect the present invention relates to a method for applying more than one green film to a substrate without the need to sinter the previously applied green film. Green film means the sol-gel film as spun and before any heating, baking or firing. The green film thus still contains organics, and the coating is an organo-metallic polymeric gel. This method involves applying a thin green film of the sol-gel to the substrate, thereafter drying the green film by boiling off most of the solvents. This can be done by heating the substrate with applied green film to a temperature above the boiling point of the solvents. Preferably heating in a range from 350° C. to about 450° C. for about 2 to 5 minutes. This produces a baked or dried film in which most of the organo-metallic gel has been decomposed or oxidized thereby volatilizing most of organics, leaving the inorganics. Thereafter the subsequent layer(s) of sol-gel green film is (are) applied and dried until the desired thickness of green film is achieved. Thereafter, the baked film is sintered.

The green thin films are preferably dried at about 400° C. The benefit of applying a green film, drying it without sintering, and thereafter applying and drying subsequent layers, is that a thick film can be applied without sintering in between each step which is time consuming and subjects the substrate to more thermal stress.

After the gel is applied to the substrate, the green thin film or multiple layers of green films are dried and oxidized to form the final sintered PLZT family ceramic, such as PLZT, PZT or PLT ceramic. As used herein "sintered" or "fired" film means one which has been heated sufficiently to crystallize the inorganic film. Preferably the oxidation is conducted in an oxygen enriched atmosphere. Oxidation in air produces acceptable results but utilization of an oxygen enriched atmosphere has been found to provide better properties in the sintered film, such as polarization. A significant aspect of the present invention is that the crystallization of the PLZT thin film ceramic can be accomplished at the lowest possible temperatures, much lower than previous believed for PLZT, to give the desired crystalline form which is the Perovskite form. Temperatures in the range of between about 475° C. and about 700° C. and preferably 500° C. to 650° C., and most preferably 550° to 650° C. In contrast, previously used sputtering techniques were conducted at temperatures over 700° C. In general, in the semiconductor industry, lower processing temperatures are very important to prevent the thermal movement of previously applied dopants, which movement would destroy the characteristics of the resulting circuit. High temperatures can also damage other previously applied integrated circuit elements.

Figure 2:
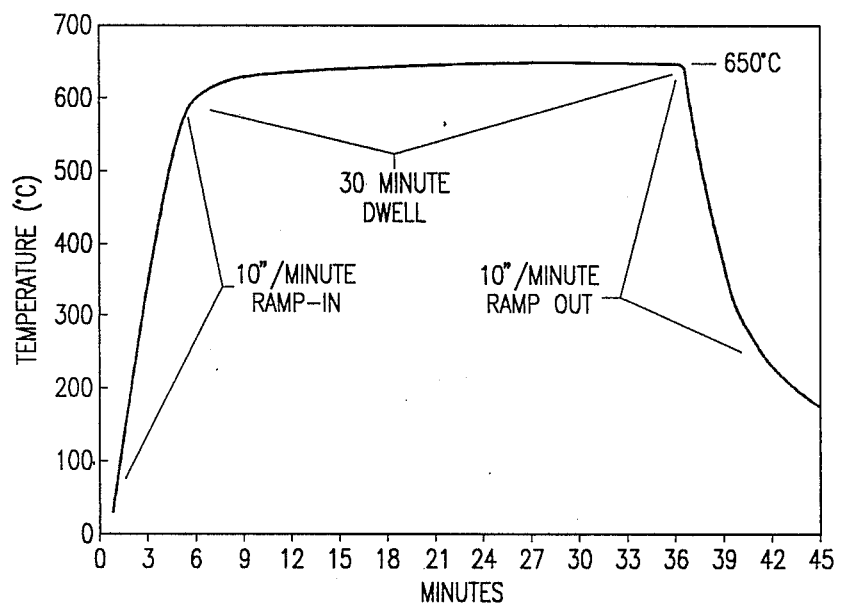
FIG. 2 shows a typical sintering profile and ramp rates for a dried green film.

FIG. 2 illustrates a typical ramp rate and dwell time for PLZT films when the applied green films have been baked prior to sintering. The green films applied generally are about 750 to about 1500 Angstroms thick, after the green films are baked, the baked film is generally about 275 to about 550 Angstroms thick, and after the baked film is sintered, the sintered is about 250 Angstroms to about 500 Angstroms. For films which are not baked prior to sintering, the initial ramp rate to reach the sintering temperature is about one third slower to allow time for the solvents to boil off.

It is desirable in the present invention to utilize solvents which evolve below 350° C. Also, it is desirable to ramp through the temperature range of 350° C. to about 450° C. in a minimum amount of time because within this temperature a pyrochlore phase of the PLZT forms. The upper temperature depends on the composition of the film. This phase is undesirable because it is not ferroelectric. Thus, the presence of solvents that would boil in that range is undesirable because the PLZT composition would be subjected to that temperature range for a longer period of time while the solvents boiled off. Low boiling point solvents are also desirable because they will burn off before the PLZT begins to crystallize. Therefore, the organics can burn off and vaporize without having carbon trapped in the metals as they crystallize. Such carbon inclusion is detrimental because it can prevent the formation of a ferroelectric phase or it can result in the formation of pinholes and pits in the film or other undesirable physical characteristics. Another reason for utilizing an excess of oxygen is to effect the complete and rapid combustion of the organics.

In a preferred embodiment, the lead precursor is lead (IV) acetate, the zirconium precursor is zirconium N-butoxide butanol complex, the titanium precursor is titanium (IV) isopropoxide and the lanthanum precursor is lanthanum 2,4 pentanedionate. These precursors are weighed out in amounts necessary to provide the desired amounts of lead, lanthanum, zirconium and titanium in the final PLZT thin film to be made. The lead tetracetate is commercially available from Morton Thiokol, Inc., Alfa Products, 152 Andover Street, Danvers, Mass. sold under the designation 57113. It is important that the lead (IV) acetate be opened under an inert atmosphere such as argon or nitrogen. If opened in an air environment the tetracetate will evaporate and the lead will oxidize and precipitate. This of course is not desirable since the oxidized lead will not be soluble. The lead (IV) acetate is dissolved in a suitable acid such as glacial acetic acid at a temperature in the range from 70° C. to 90° C. The amount of glacial acetic acid added is the amount necessary to dissolve the lead tetracetate and to give a hydrolysis reaction rate for the lead which is about equivalent to the hydrolysis rate for the other metal precursors in their solvents in the subsequent hydrolysis step. These computations should take into account that most commercial lead tetracetates contain some acetic acid which should be accounted for in the calculations.

Next a zirconium tetrabutoxide and titanium isopropoxide are dissolved either separately in their respective solvents or in a combined n-butanol and isopropanol. Zirconium tetrabutoxide is commercially available from Alfa products under the designation 88718 and titanium (IV) isopropoxide is commercially available from Alfa products under the designation 77115. The zirconium tetrabutoxide is dissolved in butyl alcohol such as n-butanol. The titanium isopropoxide is dissolved in isopropanol. It is possible to make a mixture of the n-butanol and the isopropanol together and add the titanium isopropoxide and the zirconium tetrabutoxide to that solution. Again the solvents are added in amounts sufficient to dissolve the precursors and to give approximately equal reaction rates during the hydrolysis reaction of the precursors. Lanthanum 2,4-pentanedionate, commercially available from Alfa Products under the designation 89859, because it is present in small amounts, can be dissolved in the mixture of the zirconium precursor and titanium precursor and their solvents.

The steps required to determine the respective concentrations of solvents is to determine first which precursor requires the greatest portion of solvent on a per unit basis of the precursor to be dissolved. From this the hydrolysis rate for that precursor and solvent is determined. From this rate then the amounts of solvent necessary for the other precursors can be determined. This procedure assures that there is sufficient solvent to dissolve each precursor while achieving approximately equal reaction rates for the hydrolysis reaction.

The zirconium precursor and solvent, titanium precursor and solvent and lanthanum precursor and solvent are added to the lead tetracetate and acetic acid solution while maintaining heat and agitation of the solution.

After the homogeneous mixture is obtained for the solutions, deionized water is added in amounts from about 1 to about 4 moles based upon total moles of zirconium and titanium to partially hydrolize the precursors during this phase. Heat and agitation are maintained until the clear solution becomes colorless.

The hydrolysis reaction is quenched by the dilution of the mixtures with additional solvent. The dilution is done using a mixture of additional solvents in approximately the same ratios as used previously are generally preferably. However, it has been found dilution with one or more of the solvents can be effective. In this illustrated embodiment, dilution by adding a mixture of n-butanol and isopropanol in a ratio such that the original ratio is maintained was found acceptable. Dilution assures that the hydrolysis reaction is terminated and quenched. Doubling the volume has been found effective for this purpose. The solution is then heated to boil it down to about 40% of volume before dilution, which produces a material that is a clear amber solution with a viscosity in the range of about 1 to 5 centiposes, which is appropriate for spin coating. The resulting gel from the boiling produces organometal polymers with the metal atoms homogeneously mixed throughout the polymer gel. This results in the homogeneous distribution of the metal ions in the final sintered PLZT thin film, which is extremely desirable. It is important that these solubilizing steps and gelling steps be done in a dry atmosphere or an inert atmosphere to control and predict the hydrolysis reaction such that the precipitation of solid oxides is prevented. Also, the resulting gels should be stored and applied under a dry or inert atmosphere to prevent further hydrolysis.

The resulting gel is then applied to a suitable substrate such as a silicon wafer. This is done by known techniques in the semiconductor industry. For example, a silicon wafer is centered on a vacuum chuck and cleaned by flooding with isopropanol or distillate from the sol-gel synthesis and spun dry at high speed. A small amount of the PLZT gel previously produced, for example, about 10 microliter per centimeter squared of area is placed on the center of the substrate. The spinner is accelerated to an RPM chosen to give an even coat of the desired thickness. This is a function primarily of viscosity and specific gravity of the PLZT gel and flow characteristics of that gel upon the particular substrate substance. Thereafter, the coated substrate is placed in a tube furnace, which is known as a diffusion furnace common in the semiconductor industry, for the volatilization of solvent from the gel and the sintering and annealing of the gel to the final PLZT thin film.

The sintering and annealing step involves a ramp up of the temperature to the desired maximum temperature. The ramp rate is selected such that sufficient time is allowed for volatization of decomposed organics without destroying the integrity of the coating. Too rapid a heating can cause bubbles which are deleterious or destroy the coating.

The sintering and annealing step requires the temperature to the desired maximum temperature usually in the range of from 475° to about 700° C. and preferably from 550° C. to 650° C., and a dwell time at the maximum temperature to produce the preferred Perovskite crystalline structure for the PLZT film. As explained above, the solvents should be chosen so that they boil off below about 350° C. and that the sintering/annealing step be done in an oxygen enriched atmosphere to insure volatilization and combustion of all the organosolvents and to minimize the time in which the PLZT gel is initially exposed to the temperature range wherein the nonferroelectric crystalline form is made. After sufficient dwell time at the maximum temperature to completely form the sintered PLZT thin film ceramic, the finished product is then ramped down in temperature and removed from the furnace. The ramp rates leaving the furnace are not extremely critical because the Perovskite crystalline form does not change to the nonferroelectric form while passing through the temperature range of from about 350° to about 450° C. The major consideration is thermal shock to the substrate and sintered PLZT thin film. The sintered PLZT film and the substrate structure which receives the film should be selected to minimize differences in thermal contraction rates to prevent cracking.

It was found that a PLZT solution of 2 centipose, when applied to the silicon substrate, produced an organo-metallic film on the substrate about 1500 Angstroms thick. After the volatilization, sintering and annealing processing, the resulting PLZT ceramic layer was approximately 500 Angstroms thick. Thicker layers of PLZT ceramic can be applied by multiple applications of PLZT gel over prior applied PLZT ceramic layers. To some extent the thickness of the PLZT can also be increased by increasing the viscosity of the PLZT gel Generally, it is not desirable to attempt to apply a PLZT gel beyond 1000 Angstroms in sintered thickness, because the thicker the gel is applied the more likely it is to crack. Thicker layers are produced with multiple coats.

The resulting PLZT layer on the substrate can then be patterned to form the desired circuit element configurations upon the wafer as described in copending application Ser. No. 057,099, filed concurrently herewith.

Other methods known in the semiconductor industry can be used for applying the thin film to the substrate such as spray or dip coating.

EXAMPLES

In the following examples the mole ratios have been normalized to Pb+La=1 (or 100%).

Example 1

PLZT, 8/40/60 plus 10% excess lead

The beginning point is calculation of the stoichiometry of the desired composition expressed as the L/Z/T ratio. The formula weight for each precursor and a number that determines batch size are factored in. The product of the L/Z/T ratio number and the batch size factor equals moles of element or precursor. Two additional factors are used in calculating the amount of Pb precursor: first, the % of excess Pb, and second, a correction of the quantity of solvent in the Pb precursor. An example of our calculations follows (using an 8/40/60 PLZT with 10% excess Pb. The Pb, La, Zr and Ti precursors are commercially available from:

Morton Thiokol, Inc.
Alfa Products
152 Andover Street
Danvers, MA 01923
Alfa Catalog.
57113 Lead(IV) acetate, (10% acetic acid); 90% Formula Weight (F.W.) 443.37
89859 Lanthanum 2,4-pentanedionate; F.W. 436.24
88718 Zirconium n-butoxide butanol complex; F.W. 457.81
77115 Titanium(IV) isopropoxide; F.W. 284.25
302506 Acetic acid, Glacial
11632 1-butanol
19397 Isopropanol The calculation for PLZT, 8/40/64 plus 10% excess Pb is as follows:

Pb Precursor calculation:

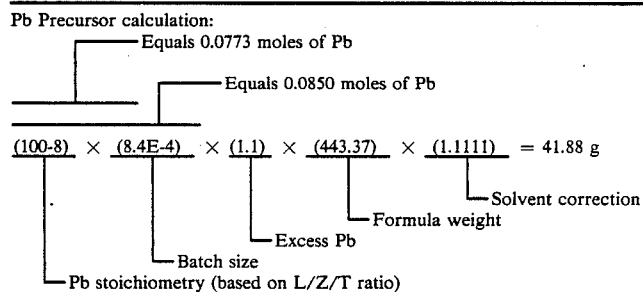

$(100-8) \times (8.4E\text{-}4) \times (1.1) \times (443.37) \times (1.1111) = 41.88$ g

- Solvent correction
- Formula weight
- Excess Pb
- Batch size
- Pb stoichiometry (based on L/Z/T ratio)
- Equals 0.0850 moles of Pb
- Equals 0.0773 moles of Pb La precursor calculation:
$(8) \times (8.4E\text{-}4) \times (436.24) = 2.93$ g — Equals 0.0067 moles of La Zr precursor calculation:
$(40) \times (8.4E\text{-}4) \times (457.81) = 15.38$ g — Equals 0.0336 moles of Zr Ti precursor calculation:
$(60) \times (8.4E\text{-}4) \times (284.25) = 14.33$ g — Equals 0.0504 moles of Ti Note that: (0.0773 mol Pb + 0.0067 mol La) = (0.0336 mol Zr + 0.0504 mol Ti)
Acetic acid (solvent for Pb precursor) = 10 ml/gram of Pb precursor*
(41.88) × (10) = 418.8 ml
1-Butanol (solvent for Zr precursor) = 4000 ml/mol of Zr*
(4000) × (40) × (8.4E-4) = 134.4 ml
Isopropanol (solvent for Ti precursor) = 4000 ml/mole of Ti*
(4000) × (60) × (8.4E-4) = 201.6 ml
Deionized water = 4 moles/mole of Zr + Ti
(4) × ((40 + 60) × (8.4E-4)) × (18) = 6.05 g (water is actually measured volumetrically with density equal to 1.0)
*Determined emperically.
Which is repeated for convenience:

-continued

|  | Mole Ratio | Actual Amount |
| --- | --- | --- |
| Lead (IV) acetate | 0.92(1.12)* | 41.88 g |
| Lanthanum 2,4-pentanedionate | 0.08 | 2.93 g |
| Zirconium n-butoxide butanol complex | 0.40 | 15.38 g |
| Titanium isopropoxide | 0.60 | 14.33 g |
| Acetic acid, glacial | 77.0 | 418.8 ml |
| N-butanol | 17.5 | 134.4 ml |
| Isopropanol | 31.1 | 201.6 ml |
| Deionized water | 4.0 | 6.05 ml |

It has been found that the sum of the calculated quantities without regard for the units involved (grams or milliliters) is a good approximation (within one percent or so) of the volume obtained when these materials are in solution.

$$41.9 + 418.8 + 2.9 + 15.4 + 14.3 + 134.4 + 201.6 + 6.1 = \underline{835.4}$$

835.4 ml is therefore the volume of a 50:50 mixture of 1-butanol and isopropanol required to double the solution volume thus quenching the reaction prior to boiling back to final volume.

*Lead is adjusted to account for excess lead and the amount of acetic acid in commercially packaged lead (IV) acetate ( 10%). The zirconium n-butoxide butanol complex was dissolved in the n-butanol and combined with the titanium solution (titanium isopropoxide dissolved in isopropanol). The lanthanum 2,4-pentanedionate was dissolved in the solution of titanium and zirconium. In a separate vessel the lead (IV) acetate was dissolved in the glacial acetic acid under an inert atmosphere while agitating and heating it in a temperature in the range of 70° to 90° C. The solution containing the zirconium, lanthanum and titanium was added to the lead solution while maintaining heat and agitation. The deionized water was then added. The amounts above produced a solution with a volume of 835 ml.

This volume was then doubled by the addition of 835 ml of a mixture in a ratio of 1:1 by volume of nbutanol and isopropanol, resulting in a total volume of 1670 ml. This was then boiled back to a volume of 334 ml or approximately 20% of the starting solution. An alternate method is to base the amount of boil off to base final volume on a fixed concentration of moles of P+L+Z+T/unit volume; specifically 5 E-4 moles/ml. In this calculation excess Pb is disregarded. In this example there are: $((100-8)+8+40+60) \times (8.4 \text{ E-4}) = 0.168$ moles of P+L+Z+T Therefore: 0.168 moles/(5E-4 moles/ml)=336 ml. 336 ml is the target for the final sol-gel volume. Viscosity of the finished sol-gel is measured at room temperature with a falling ball viscometer (Gilmont #1 with stainless steel ball); density is determined by weighing an accurately measured volume (25 ml using a volumetric pipet) of sol-gel on an analytical balance. A sol-gel with a viscosity of about 1.4 cp resulted. The prepared sol-gel was spun onto a silicon substrate of 100 mm in diameter at approximately 2000 rpm to produce a sol-gel PLZT layer of about 1500 Angstroms in thickness. This was then heated in a furnace from 549° C. to 551° C. at a ramp in of 100° C. per minute to a temperature of 550° C. where it was held for about 15 minutes to form the Perovskite PLZT. Subsequently, the PLZT substrate was returned to room temperature by ramping it down at a rate of 100° C. per minute.

EXAMPLE 2

PLT, 15/0/100 plus 10% excess lead
Pb precursor calculation:
$(100 - 15) \times (5.0E - 4) \times (1.1) \times (443.37) \times (1.111) = 23.03$ g
La precursor calculation:
$(15) \times (5.0E - 4) \times (436.24) = 3.27$ g
Zr precursor calculation
NONE
Ti precursor calculation:
$(100) \times (5.0E - 4) \times (284.25) = 14.21$ g
Acetic acid:
$(23.03) \times (10) = 230.3$ ml
1-Butanol:
NONE
Isopropanol:
$(4000) \times (100) \times (5.0E - 4) = 200.0$ ml
Deionized water:
$(4) \times (100) \times (5.0E - 4) \times (18) = 3.6$ g (or ml)
which is repeated in the table below for convenience

|  | Mole Ratio | Amount |
| --- | --- | --- |
| Lead (IV) acetate | 0.85 (1.039) | 23.03 g |
| Lanthanum 2,4-pentanedionate | 0.15 | 3.27 g |
| Zirconium | 0.0 | 0.0 |
| Titanium isopropoxide | 1.0 | 14.21 g |
| Acetic Acid | 77.5 | 230.3 ml |
| N-butanol | 0.0 | 0.0 |
| Isopropanol | 51.9 | 200.0 ml |
| Deionized water | 4.0 | 3.6 ml |

Volume doubling calculation:
$23.0 + 3.3 + 14.2 + 230.3 + 200.0 + 3.6 = 474.4$ ml
Volume is doubled with 474.4 ml or 50:50 mixture of 1-butanol and isopropanol.
Final volume calculation:
$(((100 - 15) + 15 + 0 + 100) \times (5.0E - 4))$moles/$(5E - 4$ moles/ml$) = 200$ ml Titanium isopropoxide was dissolved in isopropanol. The lanthanum 2,4-pentanedionate was dissolved in the solution of titanium. In a separate vessel the lead (IV) acetate was dissolved in the glacial acetic acid under an inert atmosphere while agitating and heating it to a temperature in the range of 70° to 90° C. The solution containing the lanthanum and titanium was added to the lead solution while maintaining heat and agitation. The deionized water was then added. The amounts above produced a solution with a volume of 474 ml.

This volume was then doubled by the addition of 474 ml of a mixture of n-butanol and isopropanol in a ratio of 1:1 by volume, resulting in a total volume of 948 ml. This was then boiled back to a volume of 190 ml resulting in a sol-gel with a viscosity of about 1.9 cp. The prepared sol-gel was spun onto a silicon substrate of 50 mm diameter at approximately 2000 rpm to produce a sol-gel PLZT layer at about 1500 Angstroms in thickness. This was then baked on a hot plate for about 2 minutes at about 400° C. This was repeated for a total of eight coats. This was then annealed or sintered in a furnace from 648° C. to 651° C. at a ramp in of 100° C. per minute to a temperature of 650° C. where it was held for about 30 minutes to form the Perovskite PLZT. Subsequently, the PLZT substrate was returned to room temperature by ramping it down at a rate of 100° C. per minute.

EXAMPLE 3

```
PZT, 0/50/50 plus 10% excess Pb.
Pb precursor calculation:
(100 − 0) × (4.326E − 4) × (1.1) × (443.37) × (1.111) = 23.44 g
La precursor calculation:
NONE
Zr precursor calculation
(50) × (4.326E − 4) × (457.81) = 9.90 g
Ti precursor calculation:
(50) × (4.326E − 4) × (284.25) = 6.15 g
Acetic acid:
(23.44) × (10) = 234.4 ml
1-Butanol:
(4000) × (50) × (4.326E − 4) = 86.5 ml
Isopropanol:
(4000) × (50) × (4.326E − 4) = 86.5 ml
Deionized water:
(4) × (50 + 50) × (4326E − 4) × (18) = 3.11 g (or ml)
Volume doubling calculation:
23.4 + 9.9 + 6.2 + 234.4 + 86.5 + 86.5 + 3.1 = 450 ml
Volume is doubled with 450 ml or 50:50 mixture of
1-butanol and isopropal.
Final volume calculation:
(((100 − 0) + 0 + 50 + 50) × (4.326E − 4))moles/(5E − 4
moles/ml = 173 ml
```

A sintered film can be formed from this composition by following the general steps outlined in the previous examples.

We claim:

1. A method of preparing a mixture suitable for spin deposition on substrates, comprising:
   (a) solubilizing amounts of two or more precursors of lead, titanium, zirconium and lanthanum in predetermined solvents said solvent being different for each precursor at proportions such that upon hydrolysis the metal precursors will exhibit approximately equal reaction rates;
   (b) mixing the metal precursors and solvents at a temperature sufficient to maintain the metal precursors in solution and for a period of time sufficient to produce a homogeneous mixture;
   (c) adding a amount of water to resulting solution sufficient to begin a hydrolysis reaction without causing precipitation of solids; and
   (d) boiling the mixture at a temperature sufficient to vaporize said solvents and aziotrope water to increase the viscosity suitable for spin coating.

2. The method of claim 1 comprising the additional step of diluting the mixture resulting from step c with additional amounts of solvents in order to quench the hydrolysis reaction followed by step d.

3. The method of claim 1 wherein said precursors are selected from the group comprising alkoxides of lanthanum, alkoxides of lead, alkoxides of titanium, alkoxides of zirconium, esters of lead, esters of titanium, and esters of zirconium.

4. The method of claim 2 wherein said metal precursors are selected from the group comprising alkoxides of lanthanum, alkoxides of lead, alkoxides of titanium, alkoxides of zirconium, esters of lead, esters of titanium, and esters of zirconium.

5. The method of claim 1 wherein said precursors are selected from the group comprising lanthanum 2,4-pentanedionate, zirconium n-butoxide, titanium (IV) isopropoxide, and lead tetracetate.

6. The method of claim 2 wherein said precursors are selected from the group comprising lanthanum 2,4-pentanedionate, zirconium n-butoxide, titanium (IV) isopropoxide, and lead tetracetate.

7. The method of claim 1 further comprising the steps of spinning the resulting solution onto a substrate to form a thin film, and then heating the coated substrate at a temperature in the range of from about 475° C. to about 700° C. for a period sufficient to sinter the applied thin film.

8. The method of claim 2 further comprising the steps of spinning the resulting solution onto a substrate to form a thin film and then heating the coated substrate at a temperature in the range of about 475° C. to about 700° C. for a period of time sufficient to sinter the applied thin film.

9. The method of claim 3 further comprising the steps of spinning the resulting solution onto a substrate to form a thin film, and then heating coated substrate at a temperature in the range from about 500° C. to about 650° C. for a period sufficient to sinter the applied thin film.

10. The method of claim 4 further the steps of spinning the resulting solution onto a substrate to form a thin film, and then heating the coated substrate at a temperature in the range of from about 500° C. to about 650° C. for a period sufficient to sinter the applied thin film.

11. The method of claim 5 further comprising the steps of spinning the resulting solution onto a substrate to form a thin film, and then heating the coated substrate at a temperature in the range of from about 500° C. to about 650° C. for a period sufficient to sinter the applied thin film.

12. A method of preparing a PLZT mixture suitable for spin deposition on substrates, comprising:
    (a) solubilizing lead precursor in a first solvent;
    (b) solubilizing a titanium precursor in a second solvent;
    (c) solubilizing zirconium precursor in a third solvent;
    (d) mixing the dissolved lead, titanium and zirconium precursor and the first, second and third solvents together at a temperature sufficient to maintain the metals in solution and for a period of time sufficient to produce a homogeneous mixture;
    (e) adjusting the proportions of said first, second, and third solvents such that the reaction rates of the zirconium, titanium and lead upon hydrolysis of the resulting mixture will be approximately equal;
    (f) adding lanthanum precursor to the mixture;
    (g) adding an amount of water to resulting solution sufficient to begin a hydrolysis reaction without causing precipitation of solids; and
    (h) boiling the mixture at a temperature sufficient to vaporize the said water and solvents until the mixture reaches viscosity suitable for spin coating.

13. The method of claim 12 comprising the addition of diluting the resulting mixture from step (g) with additional amounts or one or more of said solvents in an amount sufficient to quench the hydrolysis reaction followed by step (h).

14. The method of claim 12 wherein the precursors of said lead, titanium and zirconium are selected from the group comprising alkoxides, and esters of said lead, titanium and zirconium and said lanthanum precursor is selected from the group comprising alkoxides, and esters of lanthanum.

15. The method of claim 13 wherein the precursors of said lead, titanium and zirconium are selected from the group comprising alkoxides, and esters of said lead, titanium and zirconium, and said lanthanum precursor is selected from the group comprising alkoxides, and esters of lanthanum.

16. The method of claim 12 further comprising the steps of spinning the resulting PLZT solution onto a substrate to form a thin film, and then heating the coated substrate at a temperature in the range of about 475° to about 700° C. for a period sufficient to sinter the PLZT film.

17. The method of claim 3 further comprising the steps of spinning the resulting PLZT solution onto a substrate to form a thin film, and then heating the coated substrate at a temperature in the range of about 475° C. to about 700° C. for a period sufficient to sinter the PLZT film.

18. A method for preparing a PLZT mixture suitable for spin deposition on substrates, comprising:
  (a) solubilizing a lead precursor in a first solvent;
  (b) solubilizing a titanium precursor in a second solvent compatible with said first solvent;
  (c) solubilizing a zirconium precursor in a third solvent compatible with first and second solvents;
  (d) mixing the dissolved lead, titanium and zirconium precursors in the first, second and third solvents together at a temperature sufficient to maintain the metals in solution for a period of time sufficient to produce a homogeneous mixture;
  (e) adjusting the proportions of said first, second and third solvents such that the reaction rates of the zirconium, titanium and lead upon hydrolysis of the resulting mixture will be approximately equal;
  (f) adding lanthanum to the mixture;
  (g) adding water to the resulting solution sufficient to begin a hydrolysis reaction of the precursors without causing precipitation of solids; and
  (h) boiling the mixture at a temperature sufficient to vaporize the water and said solvents reducing the solvent and water content of a mixture to increase the viscosity suitable for spin coating.

19. The method of claim 18 further comprising the additional step of diluting the mixture resulting from step (g) with additional amounts of one or more of said solvents in an amount sufficient to quench the hydrolysis reaction thereafter followed by step (h).

20. The method of claim 18 wherein the precursors of said lead, titanium and zirconium are selected from the group comprising oxides, acetates and esters of said lead, titanium and zirconium.

21. The method of claim 19 wherein the precursors of said lead, titanium and zirconium are selected from the group comprising oxides, acetates and esters of said lead, titanium and zirconium.

22. The method of claim 18 further comprising the steps of spinning the resulting PLZT solution onto a substrate to from a thin film, and then heating the coated substrate at a temperature in the range of about 475° C. to about 700° C. for a period sufficient to sinter the PLZT film.

23. The method of claim 22 further comprising the steps of spinning the resulting PLZT solution onto a substrate to from a thin film, and then heating the coated substrate at a temperature in the range of about 475° C. to about 700° C. for a period sufficient to sinter the PLZT film.

24. The method of claim 18 wherein said lead precursor is lead tetracetate, said zirconium precursor is zirconium N-butoxide, and said titanium precursor is titanium isopropoxide.

25. The method of claim 19 wherein said lead precursor is lead tetracetate, said zirconium precursor is zirconium N-butoxide, and said titanium precursor is titanium isopropoxide.

26. A method of preparing a mixture suitable for spin deposition on substrates, comprising:
  (a) solubilizing amounts of one or more precursors of lead, titanium, and zirconium in predetermined solvents, said solvents being different for each precursor, at proportions such that upon hydrolysis the metal precursors will exhibit approximately equal reaction rates;
  (b) mixing the metal precursors and solvents together with lanthanum;
  (c) maintaining the mixture at a temperature sufficient to maintain the metal precursors and lanthanum in solution and for a period of time sufficient to produce a homogeneous mixture;
  (d) adding a predetermined amount of water to resulting solution sufficient to begin a hydrolysis reaction without causing precipitation of solids; and
  (3) boiling the mixture at a temperature sufficient to vaporize said solvents and water to increase the viscosity suitable for spin coating.

27. The method of claim 26 comprising the additional step of diluting the mixture resulting from step d with additional amounts of solvents in order to quench the hydrolysis reaction followed by step c.

28. The method of claim 26 wherein said precursors are selected from the group comprising alkoxides of lead, alkoxides of titanium, alkoxides of zirconium, esters of lead, esters of titanium, and esters of zirconium.

29. The method of claim 27 wherein said metal precursors are selected from the group comprising alkoxides of lead, alkoxides of titanium, alkoxides of zirconium, esters of lead, esters of titanium, and esters of zirconium.

30. The method of claim 26 wherein said precursors are selected from the group comprising zirconium nbutoxide, titanium (IV) isopropoxide, and lead tetracetate.

31. The method of claim 27 wherein said precursors are selected from the group comprising zirconium nbutoxide, titanium (IV) isopropoxide, and lead tetracetate.

32. The method of claim 26 further comprising the steps of spinning the resulting solution onto a substrate to form a thin film, and then heating the coated substrate at a temperature in the range of from about 475° C. to about 700° C. for a period sufficient to sinter the applied thin film.

33. The method of claim 27 further comprising the steps of spinning the resulting solution onto a substrate to form a thin film and then heating the coated substrate at a temperature in the range of about 475° C. to about 700° for a period of time sufficient to sinter the applied thin film.

34. The method of claim 28 further comprising the steps of spinning the resulting solution onto a substrate to form a thin film, and then heating the coated substrate at a temperature in the range of from about 500° C. to about 650° C. for a period sufficient to sinter the applied thin film.

35. The method of claim 29 further comprising the steps of spinning the resulting solution onto a substrate to form a thin film, and then heating the coated substrate at a temperature in the range of from about 500° C. to about 650° C. for a period sufficient to sinter the applied thin film.

36. The method of claim 30 further comprising the steps of spinning the resulting solution onto a substrate to form a thin film, and then heating the coated substrate at a temperature in the range of from about 500° C. to about 650° C. for a period sufficient to sinter the applied thin film.

* * * * *

UNITED STATES PATENT AND TRADEMARK OFFICE
CERTIFICATE OF CORRECTION

PATENT NO. : 4,946,710
DATED : August 7, 1990
INVENTOR(S) : Miller, et al.

It is certified that error appears in the above-identified patent and that said Letters Patent is hereby corrected as shown below:

Column 1, line 49, delete "$PbOLa_2O_3-ZrO_2-TiO_2$" and insert therefore --$PbO-La_2O_3-ZrO_2-TiO_2$--.

Column 2, line 6, delete "SolGel" and insert therefore --Sol-Gel--.

Column 6, line 24, delete "$Pb_{0.97}La_{0.03}Zr_{0.70}TiO_{0.30})O_3$" and insert therefore --$Pb_{0.97}La_{0.03}(Zr_{0.70}Ti_{0.30})O_3$--.

Column 6, line 44, delete "Solgel" and insert therefore --Sol-gel--.

Column 10, line 65, delete "2,4pentanedionate" and insert therefore --2,4-pentanedionate--.

Column 13, line 14, delete "gel Generally" and insert therefore --gel. Generally--.

Column 15, line 42, delete "nbutanol" and insert therefore --n-butanol--.

Column 18, line 19, after "heating" insert --the--.

Column 18, line 20, after "range" insert --of--.

Column 18, line 23, after "further" insert --comprising--.

Column 19, line 10, after "475°" insert --C.--.

Column 20, line 43, delete "nbutoxide" and insert therefore --n-butoxide--.

UNITED STATES PATENT AND TRADEMARK OFFICE
CERTIFICATE OF CORRECTION

PATENT NO. : 4,946,710

DATED : August 7, 1990

INVENTOR(S) : Miller, et al.

It is certified that error appears in the above-identified patent and that said Letters Patent is hereby corrected as shown below:

Column 20, line 46, delete "nbutoxide" and insert therefore --n-butoxide--.

Column 20, line 58, after "700°" insert --C.--.

Signed and Sealed this

Twelfth Day of November, 1991

Attest:

HARRY F. MANBECK, JR.

*Attesting Officer*     *Commissioner of Patents and Trademarks*